United States Patent
Tae et al.

(10) Patent No.: US 8,988,627 B2
(45) Date of Patent: Mar. 24, 2015

(54) THIN-FILM TRANSISTOR SUBSTRATE AND METHOD FOR MANUFACTURING THE SAME

(75) Inventors: Chang-Il Tae, Seoul (KR); Yeo-Geon Yoon, Seoul (KR); Swae-Hyun Kim, Asan-si (KR); Jae-Hwa Park, Gumi-si (KR)

(73) Assignee: Samsung Display Co., Ltd., Yongin (KR)

( * ) Notice: Subject to any disclaimer, the term of this patent is extended or adjusted under 35 U.S.C. 154(b) by 287 days.

(21) Appl. No.: 13/431,465

(22) Filed: Mar. 27, 2012

(65) Prior Publication Data
US 2013/0038806 A1 Feb. 14, 2013

(30) Foreign Application Priority Data
Aug. 12, 2011 (KR) .......... 10-2011-0080573

(51) Int. Cl.
*G02F 1/1333* (2006.01)
*H01L 27/12* (2006.01)
*G09G 3/00* (2006.01)
*H01L 21/66* (2006.01)
*G02F 1/1362* (2006.01)
*G02F 1/167* (2006.01)

(52) U.S. Cl.
CPC .............. *H01L 27/124* (2013.01); *G09G 3/006* (2013.01); *H01L 22/32* (2013.01); *G02F 2001/136254* (2013.01); *G02F 2001/1676* (2013.01); *G09G 2300/0426* (2013.01); *G09G 2330/12* (2013.01)
USPC ............................................. 349/54; 349/192

(58) Field of Classification Search
None
See application file for complete search history.

(56) References Cited

U.S. PATENT DOCUMENTS

| | | | |
|---|---|---|---|
| 2004/0119917 A1* | 6/2004 | Lim ............................... | 349/110 |
| 2010/0155734 A1* | 6/2010 | Lee et al. ....................... | 257/59 |
| 2010/0157190 A1* | 6/2010 | Lee et al. ....................... | 349/54 |
| 2010/0213969 A1* | 8/2010 | Kim ............................... | 324/770 |

FOREIGN PATENT DOCUMENTS

| | | |
|---|---|---|
| JP | 2008-180935 | 8/2008 |
| KR | 10-2003-0044361 | 6/2003 |
| KR | 10-2005-0097035 | 10/2005 |

* cited by examiner

*Primary Examiner* — Thanh-Nhan P Nguyen
(74) *Attorney, Agent, or Firm* — H.C. Park & Associates, PLC

(57) ABSTRACT

A thin-film transistor (TFT) substrate includes a base substrate, a test pad and a test pad line. The base substrate includes a display area including a data line and a TFT, a peripheral area including a common voltage line, and a test area disposed outside of the peripheral area. The test pad is disposed in the test area and electrically connected to the data line. The test pad line connects the data line with the test pad and crosses the common voltage line.

18 Claims, 21 Drawing Sheets

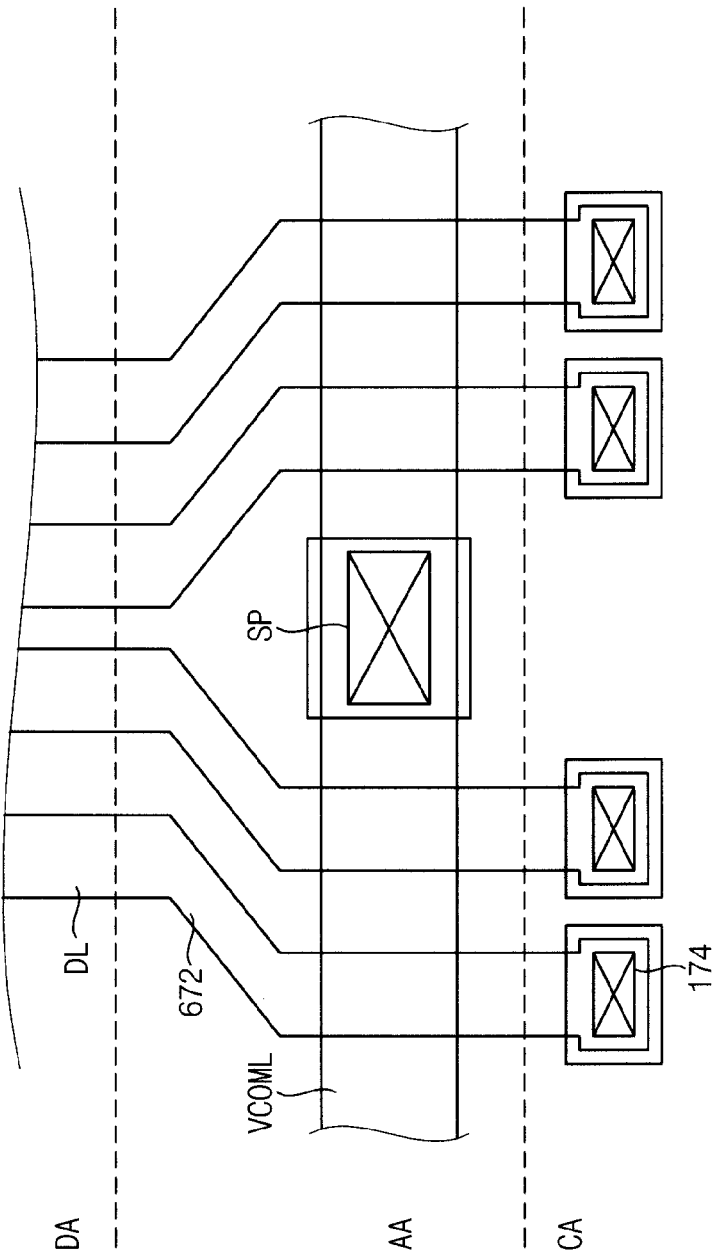

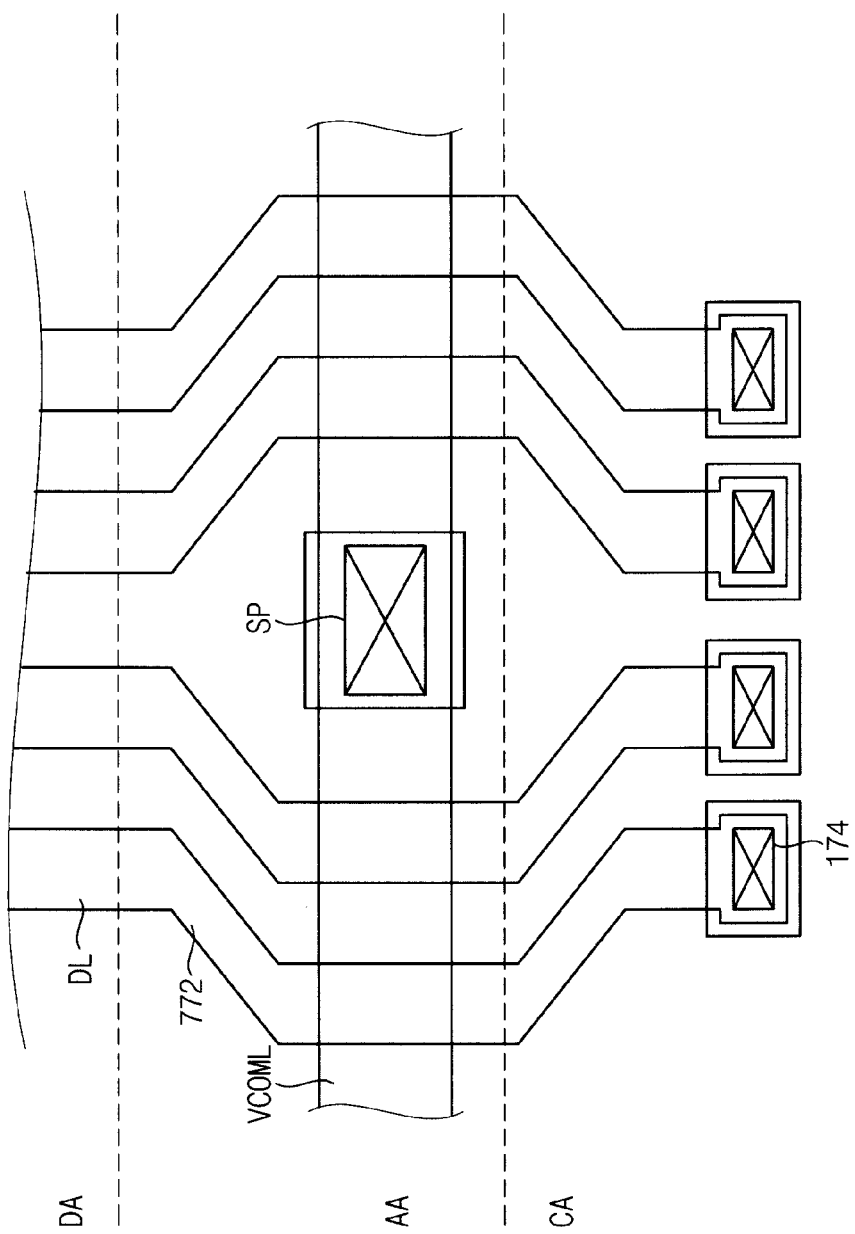

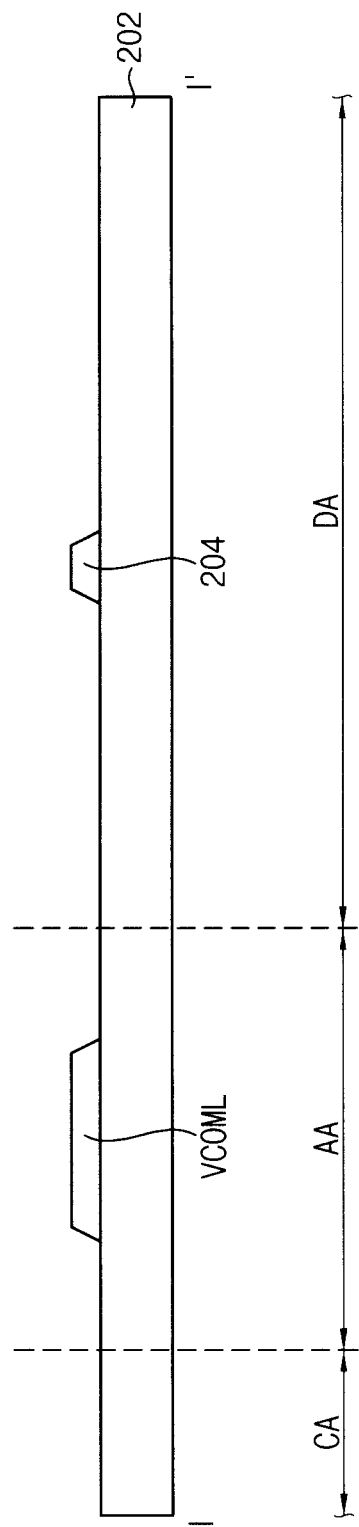

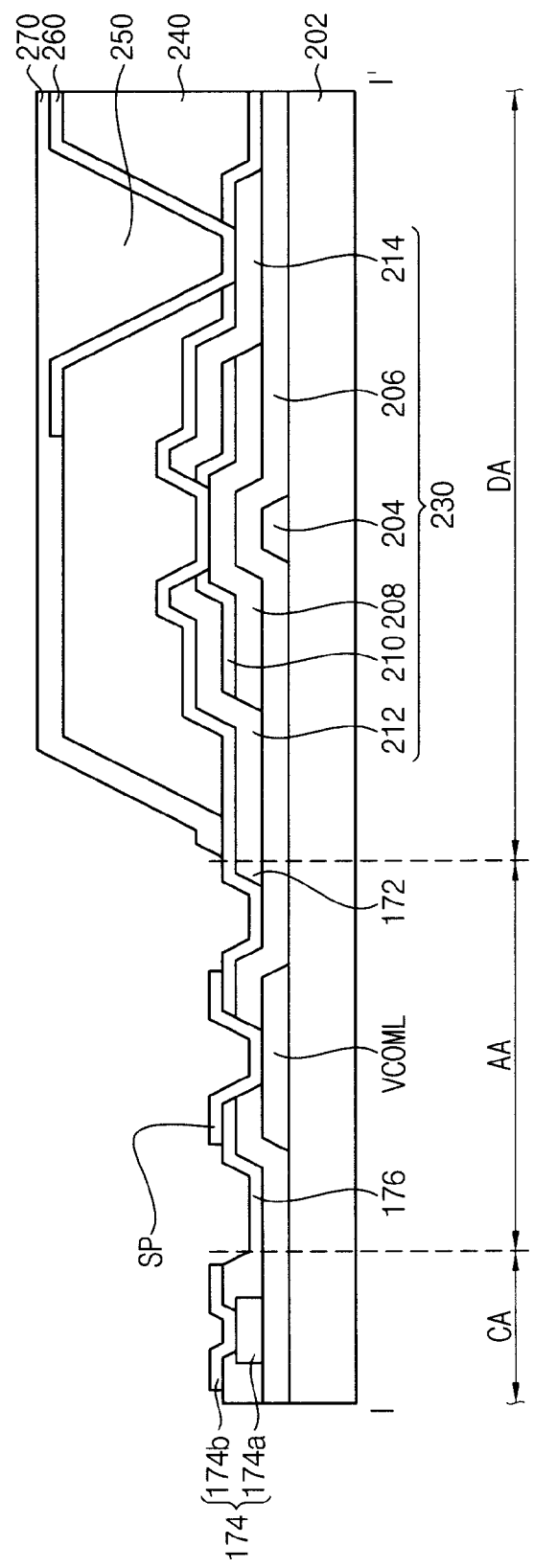

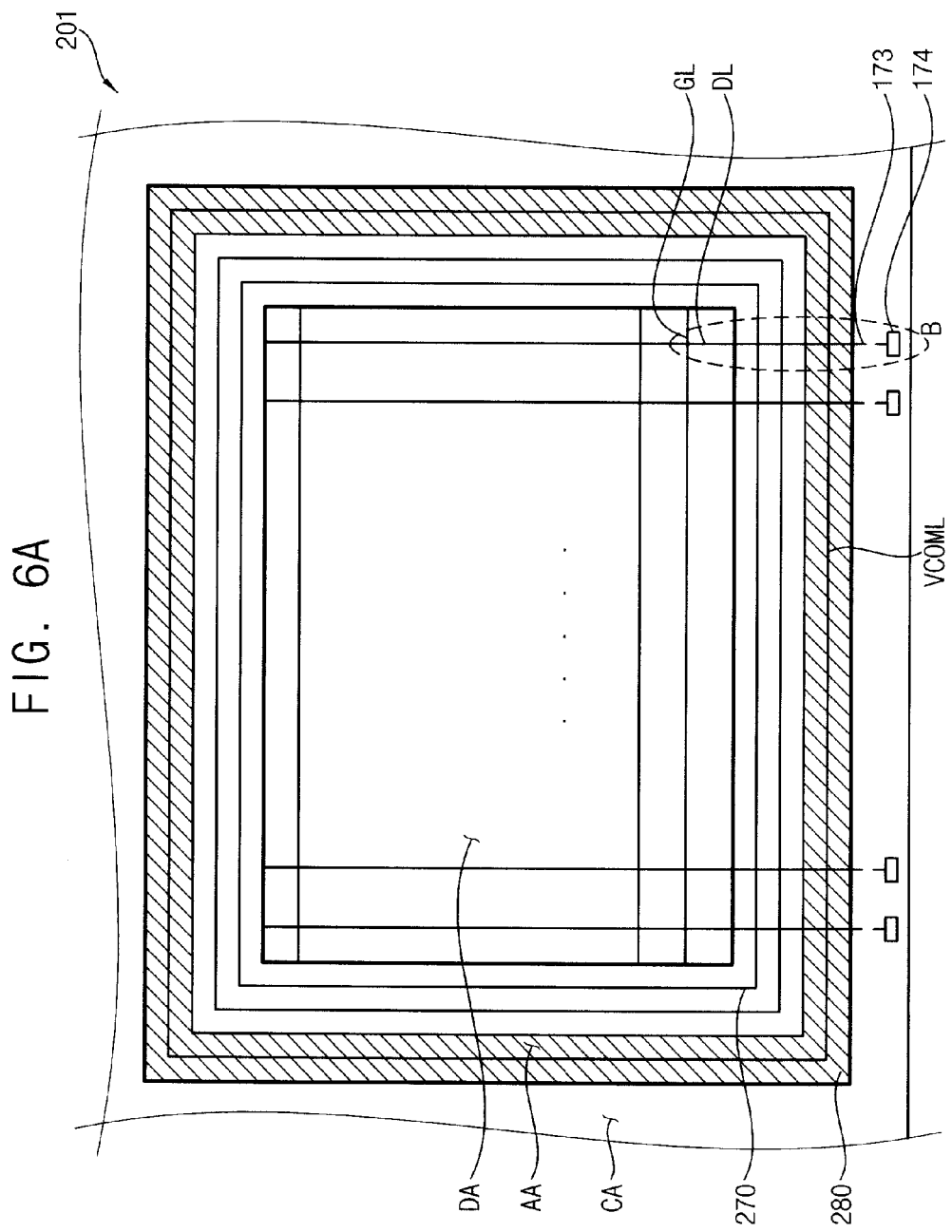

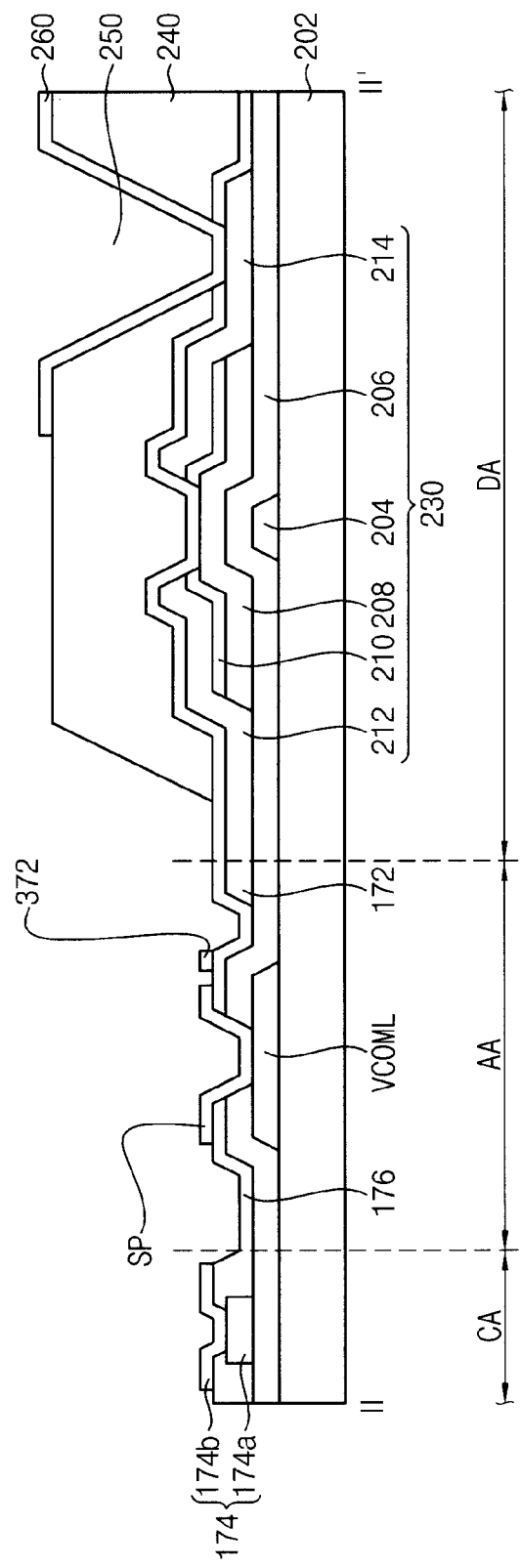

THIN-FILM TRANSISTOR SUBSTRATE AND METHOD FOR MANUFACTURING THE SAME

CROSS-REFERENCE TO RELATED APPLICATION

This application claims priority from and the benefit of Korean Patent Application No. 10-2011-0080573, filed on Aug. 12, 2011, the entire disclosure of which is incorporated herein by reference for all purposes.

BACKGROUND

1. Field

The following description relates to a thin-film transistor (TFT) substrate, a method for manufacturing the TFT substrate and a display apparatus having the TFT substrate.

2. Discussion of the Background

A liquid crystal display apparatus generally includes a lower substrate, an upper substrate and a liquid crystal layer interposed between the lower substrate and the upper substrate. The lower substrate, such as a TFT substrate, may include a display area. The display area may include a first peripheral area, a second peripheral area, a third peripheral area, and a fourth peripheral area disposed on the display area.

A gate driving part outputting a gate signal to a gate line of the display area may be disposed in the first peripheral area. The first peripheral area may be disposed at a left side of the display area. A data driving part outputting a data signal to a data line of the display area may be disposed in the third peripheral area. The third peripheral area may be disposed at an upper side of the display area. In addition, a test pad to test an electrical short and/or an open electrical circuit of the data line may be formed between a sealing member and the display area in the fourth peripheral area. The fourth peripheral area may be facing the third peripheral area.

The test pad may be disposed between the sealing member and the display area in the fourth peripheral area. Some distance may be formed between the test pad and the sealing member to prevent or reduce the likelihood of the sealing member from being uncured due to an overlap of the test pad and the sealing member. Thus, a narrow bezel display apparatus may be hard to manufacture.

SUMMARY

Exemplary embodiments of the present invention provide a TFT substrate that may have a narrower peripheral area.

Additional features of the invention will be set forth in the description which follows, and in part will be apparent from the description, or may be learned by practice of the invention.

Exemplary embodiments of the present invention provide a thin-film transistor (TFT) substrate including a base substrate including a display area including a data line and a TFT, a peripheral area including a common voltage line, a test area disposed outside of the peripheral area; a test pad disposed in the test area and electrically connected to the data line; and a test pad line connecting the data line with the test pad and crossing the common voltage line.

Exemplary embodiments of the present invention provide a method for manufacturing a TFT substrate including forming a common voltage line in a peripheral area of a base substrate, the base substrate including a display area to display an image, and a test area disposed outside of the peripheral area, the peripheral area surrounding the display area; forming a data line disposed in the display area and a test pad line disposed in the peripheral area, and the test pad line crosses the common voltage line; and forming a test pad in the test area, in which the test pad is connected to the test pad line.

Exemplary embodiments of the present invention provide a display apparatus including a first base substrate including a display area, a peripheral area, a data line, a thin-film transistor (TFT), and a pixel electrode; a common voltage line disposed in the peripheral area of the first base substrate; a test area disposed outside of the peripheral area of the first base substrate; a test pad disposed in the test area and electrically connected to the data line; a test pad line crossing the common voltage line; a second base substrate facing the first base substrate; a common electrode disposed on the second base substrate; and a liquid crystal layer interposed between the first base substrate and the second base substrate.

It is to be understood that both the foregoing general description and the following detailed description are exemplary and explanatory and are intended to provide further explanation of the invention as claimed. Other features and aspects will be apparent from the following detailed description, the drawings, and the claims.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

FIG. 4A, FIG. 4B, and FIG. 4C are plan views illustrating a test pad line according to an exemplary embodiment of the present invention.

FIG. 5A, FIG. 5B, FIG. 5C, and FIG. 5D are cross-sectional views illustrating a method for manufacturing a TFT substrate according to an exemplary embodiment of the invention.

FIG. 6A is a plan view illustrating a TFT substrate according to an exemplary embodiment of the present invention.

FIGS. 10A, FIG. 10B, FIG. 10C, and FIG. 10D are cross-sectional views illustrating a method for manufacturing a TFT substrate according to an exemplary embodiment of the present invention.

DETAILED DESCRIPTION OF THE ILLUSTRATED EMBODIMENTS

Figure 1:
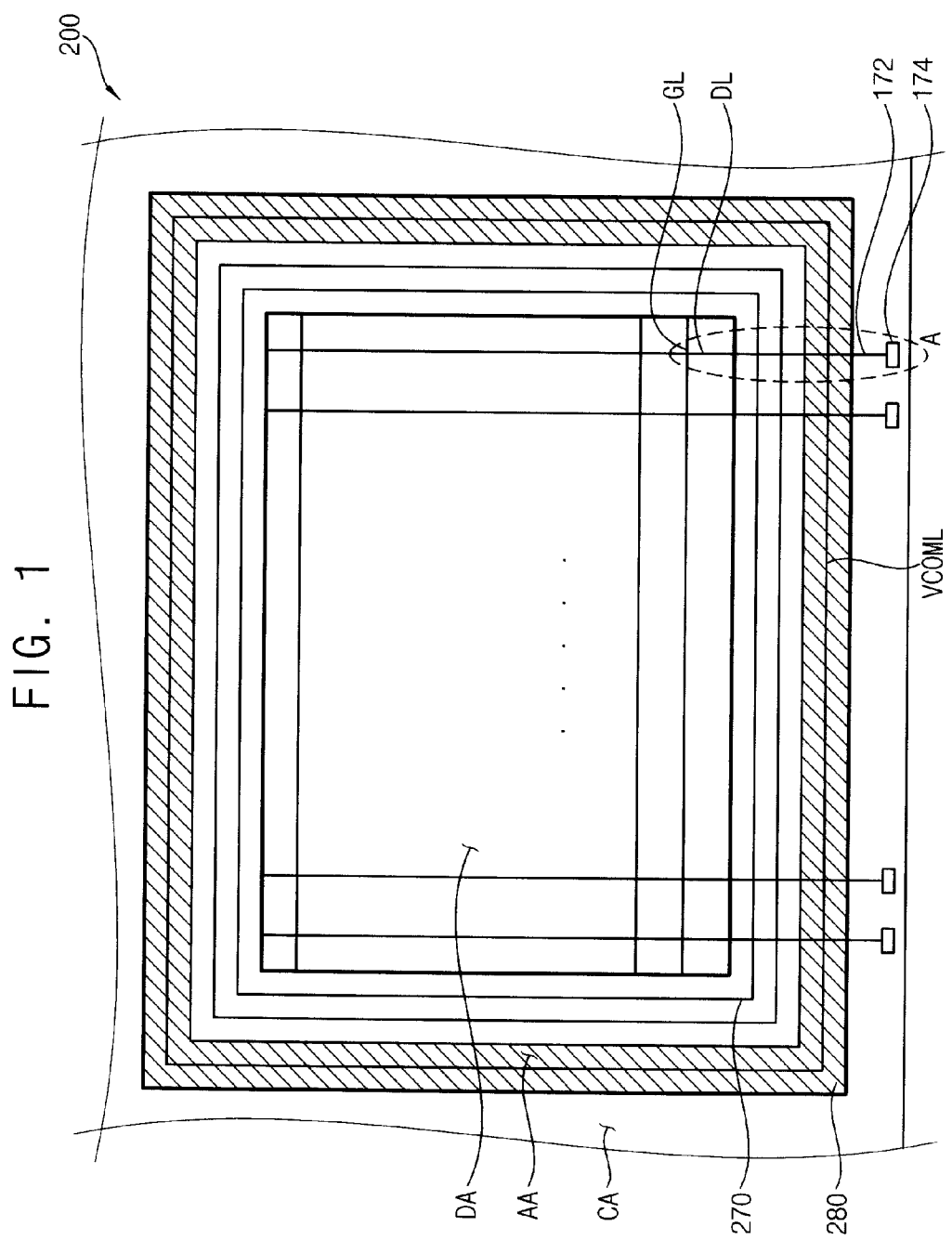
FIG. 1 is a plan view illustrating a thin-film transistor (TFT) substrate according to an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. It will be understood that for the purposes of this disclosure, "at least one of X, Y, and Z" can be construed as X only, Y only, Z only, or any combination of two or more items X, Y, and Z (e.g., XYZ, XZ, XYY, YZ, ZZ). Throughout the drawings and the detailed description, unless otherwise described, the same drawing reference numerals are understood to refer to the same elements, features, and structures. The relative size and depiction of these elements may be exaggerated for clarity.

It will be understood that when an element is referred to as being "connected to" another element, it can be directly connected to the other element, or intervening elements may be present. Also, when an element is referred to as being "formed on" another element, it can be directly formed or disposed, in part or as a whole, on the other element or intervening elements may be present.

Figure 2:
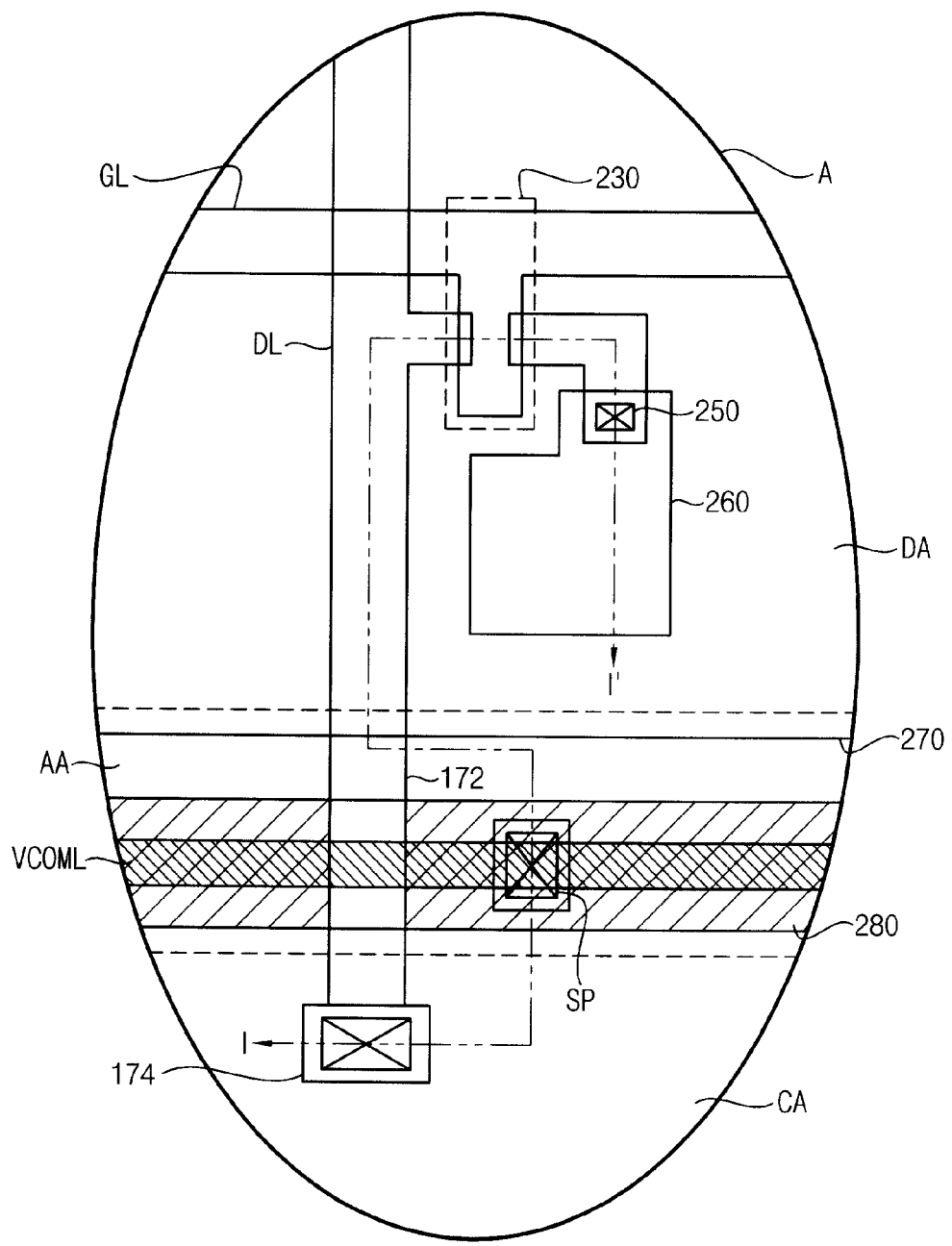
FIG. 2 is an enlarged plan view illustrating a portion 'A' of FIG. 1.
Figure 3:
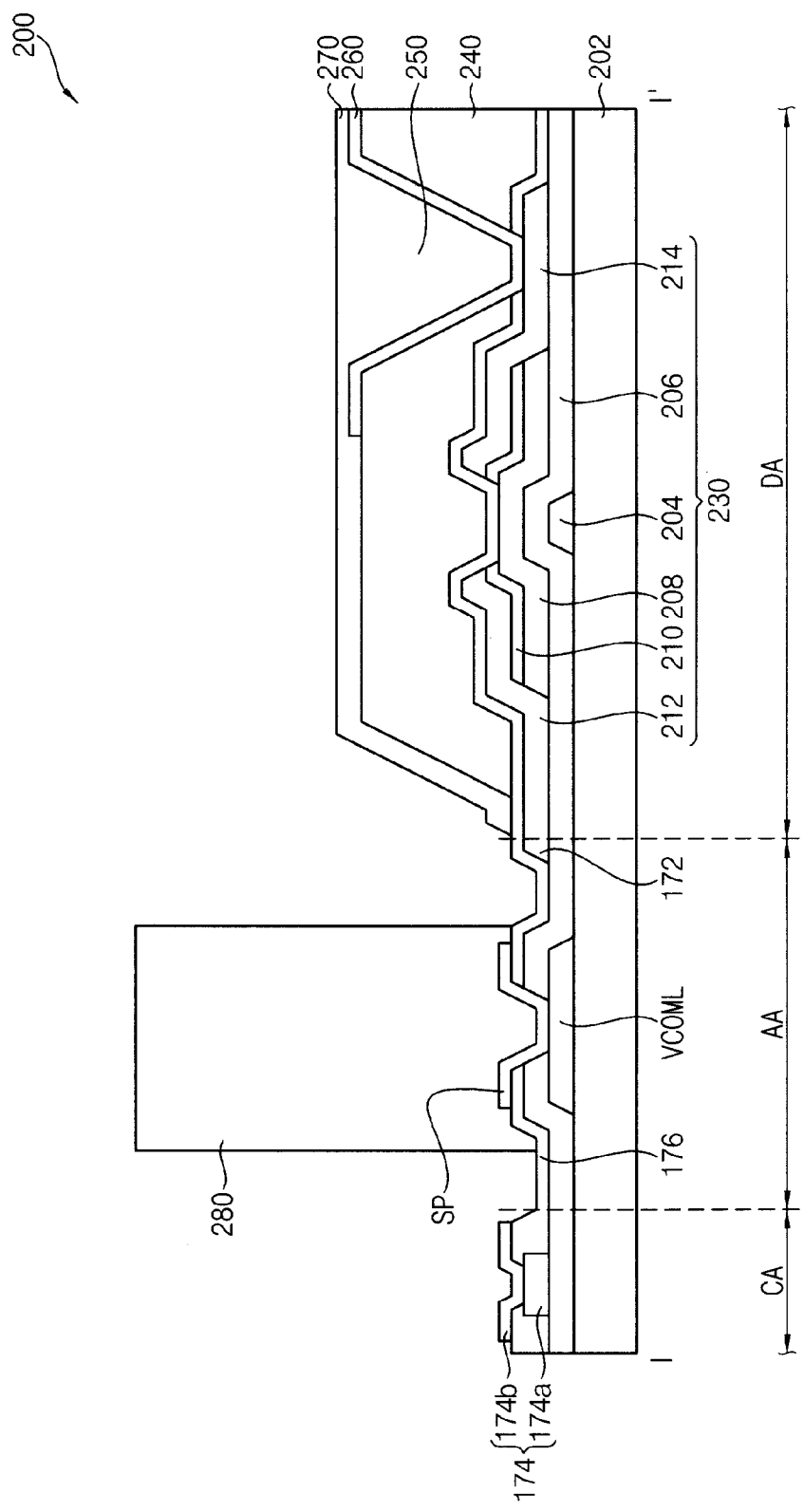
FIG. 3 is a cross-sectional view taken along a line I-I' of FIG. 2.

FIG. 1 is a plan view illustrating a thin-film transistor (TFT) substrate according to an exemplary embodiment of the present invention, FIG. 2 is an enlarged plan view illustrating a portion 'A' of FIG. 1, and FIG. 3 is a cross-sectional view taken along a line I-I' of FIG. 2.

Referring to FIG. 1, FIG. 2, and FIG. 3, the TFT substrate 200 includes a display area DA, a peripheral area AA and a test area CA. The TFT substrate 200 may include, without limitation, a lower substrate of a display apparatus, such as a liquid crystal display apparatus and an electrophoretic display apparatus.

A plurality of gate lines GL and a plurality of data lines DL, which may cross the gate lines GL, are formed in the display area DA of the TFT substrate 200 to display an image. In addition, a plurality of pixels may be formed in the display area DA. One or more of these pixels may include a TFT 230 connected with one or more gate lines GL and one or more data lines DL, and a pixel electrode 260 electrically connected with the TFT 230.

The TFT substrate 200 may include a first base substrate 202, the gate lines GL, the data lines DL, the TFT 230 disposed on the first base substrate 202, an organic insulating layer 240 formed on the TFT 230, the pixel electrode 260 formed on the organic insulating layer 240 and electrically connected with a drain electrode 214 of the TFT 230 through a contact hole 250 formed through the organic insulating layer 240, and a first alignment layer 270 formed on the pixel electrode 260 to align a liquid crystal of a liquid crystal layer, in the display area DA.

The TFT 230 includes a gate electrode 204 formed on the first base substrate 202 and extended from the gate line GL, an insulating layer 206 formed on the gate electrode 204, an active layer 208 formed on the insulating layer 206, an ohmic-contact layer 210 separately formed on the active layer 208, a source electrode 212, which may extend from the data line DL, formed on the ohmic-contact layer 210, and the drain electrode 214 formed on the ohmic-contact layer 210 and spaced apart from the source electrode 212.

A common voltage line VCOML transferring a common voltage is formed in the peripheral area AA, which surrounds the display area DA of the TFT substrate 200. A short point SP electrically connected with the common voltage line is formed on the common voltage line VCOML to transfer the common voltage of the common voltage line VCOML to a common electrode of an upper substrate.

A sealing member 280, which may be adhered to the upper substrate connected with the TFT substrate 200, is formed in the peripheral area AA to seal the liquid crystal of the liquid crystal layer. The sealing member 280 may include a conductive material, and may be formed on the short point SP to make contact with the common electrode of the upper substrate. Accordingly, the upper substrate may be connected with the TFT substrate 200. Thus, the sealing member 280 may receive the common voltage from the short point SP electrically connected with the common voltage line VCOML and may transfer the common voltage to the common electrode. The sealing member 280 may be spaced apart from the first alignment layer 270 to prevent or reduce the likelihood of the sealing member 280 from becoming uncured in forming the sealing member 280.

The test area CA of the TFT substrate 200 is disposed outside of the peripheral area AA, in which the common voltage line VCOML is formed. The test area CA may be an area that is removed after the TFT substrate 200 and the upper substrate are coupled together or after the data line DL is tested. A test pad 174 to test the data line DL is formed in the test area CA. The test pad 174 may be connected with the data line DL, which is formed in the displayed area DA.

A test pad line 172 connecting the data line DL with the test pad 174 is formed between the data line DL and the test pad 174. Thus, the test pad line 172 connects the data line DL with the test pad 174, and crosses the common voltage line VCOML in the peripheral area AA.

The common voltage line VCOML is formed in the peripheral area AA on the first base substrate 202 of the TFT substrate 200, the insulating layer 206 is formed on the common voltage line VCOML, and the test pad line 172 crossing the common voltage line VCOML is formed on the insulating layer 206.

The insulating layer 206 is formed, at least in part, in the test area CA on the first base substrate 202 of the TFT substrate 200, and the test pad 174 is formed on the insulating layer 206. The test pad 174 may include a test pad end portion 174a electrically connected with the data line DL through the test pad line 172, and a test pad electrode 174b electrically connected with the test pad end portion 174a. The test pad 174 may make contact with an external jig (not shown) that supplies a test signal to the data line DL. The test pad 174 may receive the test signal to test an open electrical circuit and/or an electrical short of the data line DL.

A passivation layer 176 may be further formed on the TFT 230, the test pad line 172 and the test pad 174.

The test pad line 172 may have a variable shape according to a position of the test pad line 172 and the short point SP.

Figure 4A:
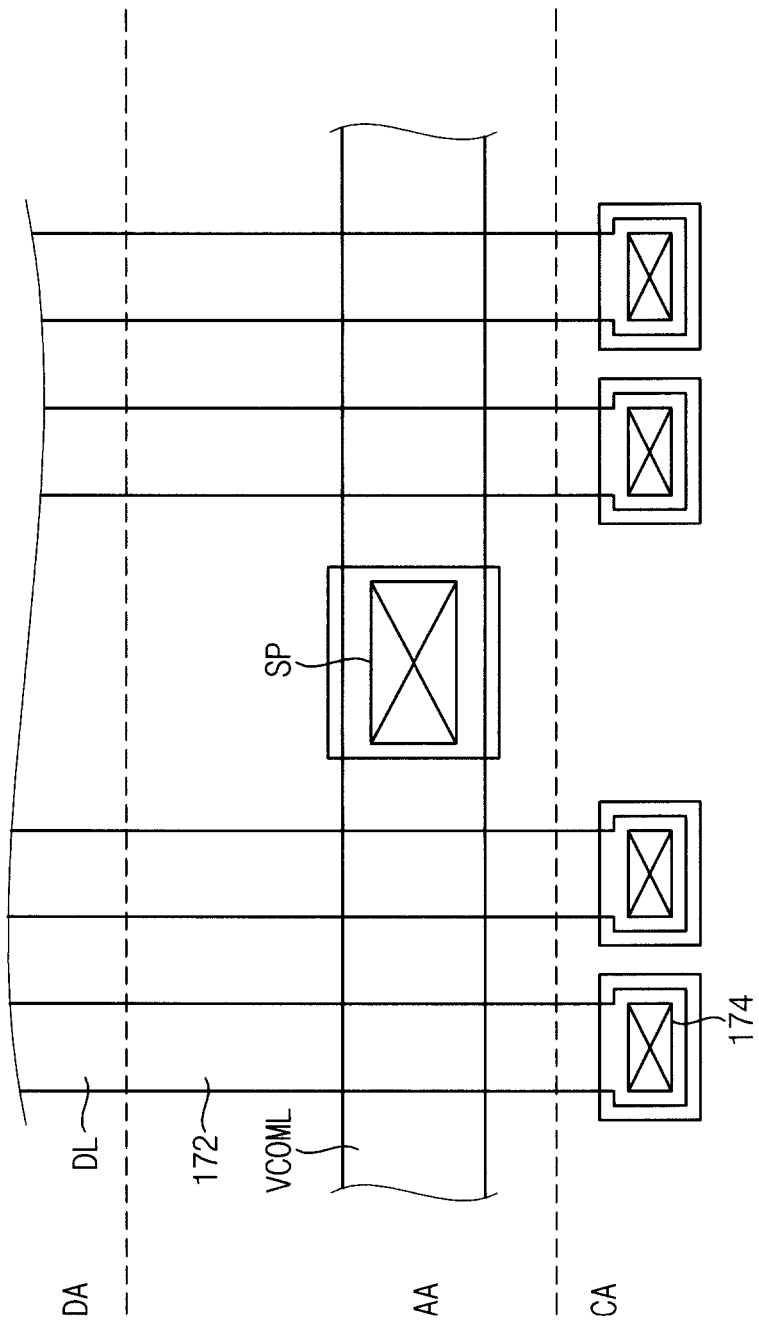

FIG. 4A, FIG. 4B, and FIG. 4C are plan views illustrating a test pad line according to an exemplary embodiment of the present invention.

Referring to FIG. 4A, the short point SP is formed on the common voltage line VCOML and the short point SP is spaced apart from the data line DL and/or a test pad line 172 connected to the test pad 174.

Referring to FIG. 4B, the short point SP is formed on the common voltage line VCOML and the short point SP is disposed on the line between the data line DL and a test pad line 672 connected to the test pad 174, and thus the test pad line 672 may have a curved or angled portion to be spaced apart from the short point SP.

Referring to FIG. 4C, the short point SP is formed on the common voltage line VCOML and the short point SP is disposed on the line between the data line DL and a test pad line 772 connected to the test pad 174, and thus the test pad line 772 may have two curved or angled portions to be spaced apart from the short point SP.

Thus, the test pad lines 172, the test pad lines 672 and the test pad lines 772 are spaced apart from the short point SP, and the short point SP is disposed between the test pad lines 172, the test pad lines 672 and the test pad lines 772.

FIG. 5A, FIG. 5B, FIG. 5C, and FIG. 5D are cross-sectional views illustrating a method for manufacturing a TFT substrate according to an exemplary embodiment of the invention.

Referring to FIG. 5A, the gate line GL (not pictured) and the gate electrode 204 may be formed on the first base substrate 202 of the display area DA, and the common voltage line VCOML is formed on the first base substrate 202 of the peripheral area AA.

Figure 5B:
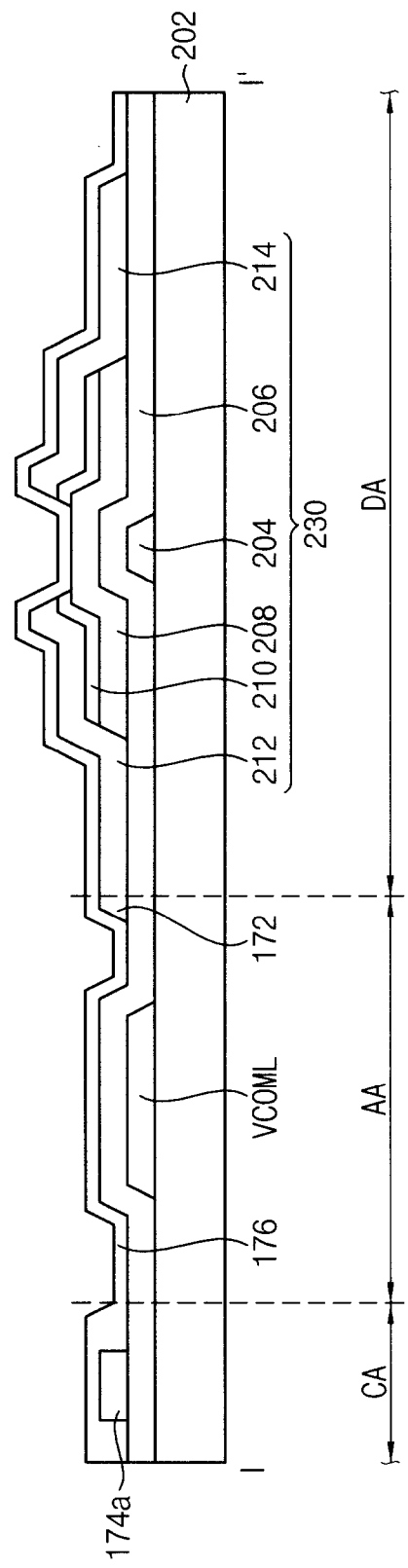

Referring to FIG. 5B, the insulating layer 206 may be formed on the gate line GL (not shown), the gate electrode 204 and the common voltage line VCOML. The active layer 208, the ohmic-contact layer 210, the data line DL (not shown), the source electrode 212 and the drain electrode 214 may be formed on the insulating layer 206 of the display area DA to form the TFT 230. In addition, the test pad line 172 crossing the common voltage line VCOML is formed on the insulating layer 206 of the peripheral area AA, and the test pad end portion 174a is formed on the insulating layer 206 of the test area CA. In addition, the passivation layer 176 is formed on or over the TFT 230, the test pad line 172 and the test pad end portion 174a.

Referring to FIG. 5C, the organic insulating layer 240 is formed on the TFT 230. The pixel electrode 260, which may be electrically connected with the drain electrode 214 of the TFT 230 through the contact hole 250, is formed on the organic insulating layer 240 of the display area DA. Further, the organic insulating layer 240 may be thickly formed on the TFT 230. The pixel electrode 260 may include indium tin oxide (ITO) or indium zinc oxide (IZO). The first alignment layer 270 is formed on the pixel electrode 260. In addition, the short point SP connected with the common voltage line VCOML through a contact hole is formed, and the test pad electrode 174b connected with the test pad end portion 174a through a contact hole is formed.

Figure 5D:
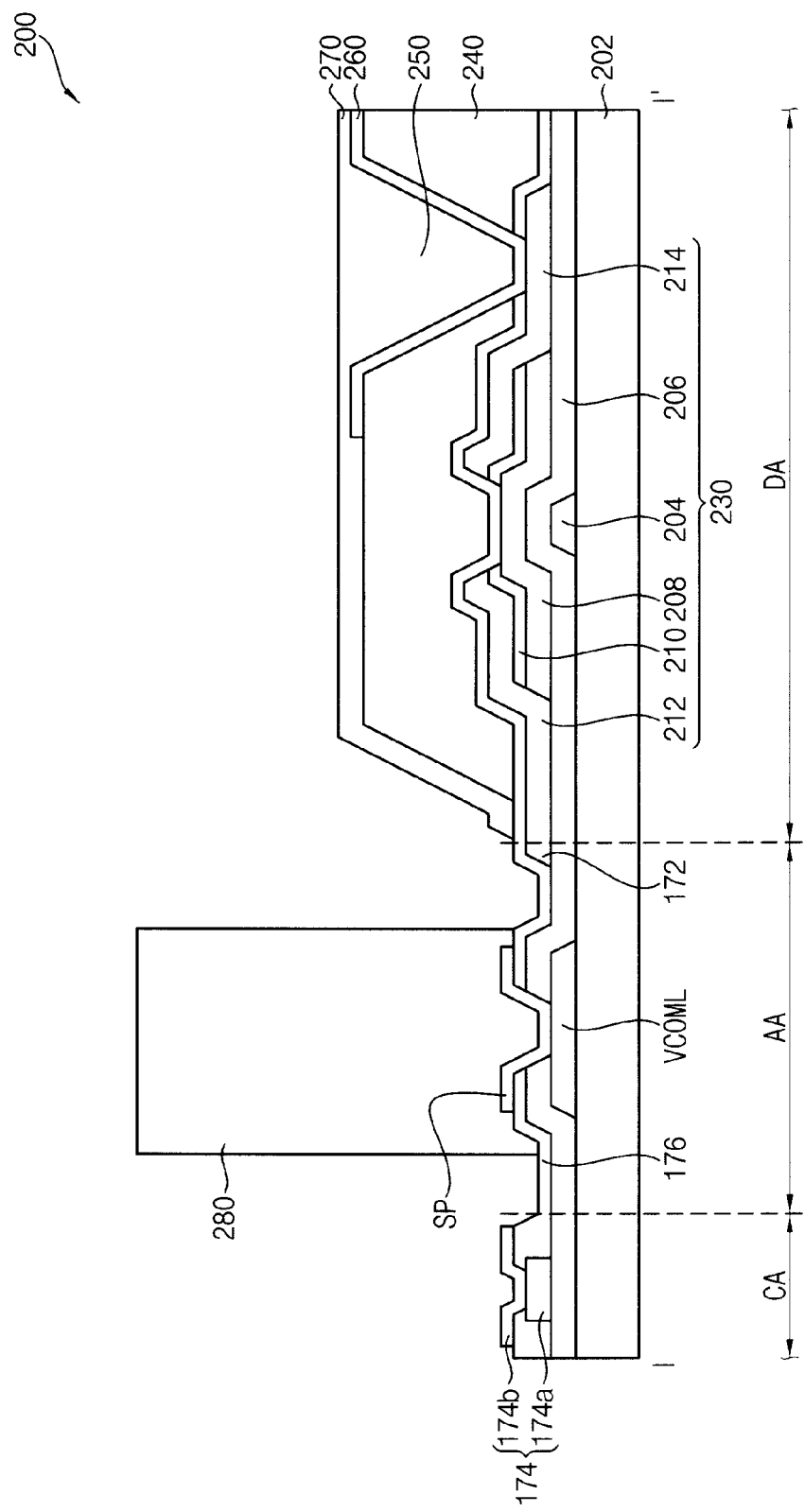

Referring to FIG. 5D, the sealing member 280 is formed in the peripheral area AA. The sealing member 280 may include a conductive material. The sealing member 280 including the conductive material is formed on the short point SP to electrically connect the short point SP with the common electrode of the upper substrate. The sealing member 280 is spaced apart from the first alignment layer 270. Although not shown in figures, if the sealing member 280 does not include the conductive material, the short point SP and the common electrode may be electrically connected with each other.

Further, a boundary between the peripheral area AA and the test area CA may be created to remove the test area CA from the peripheral area AA at a point in time.

In addition, the test signal to test the data line DL may be applied to the test pad 174 before the test area CA is removed.

The test pad 174 may be used to test the data line DL that is formed in the test area CA, which is disposed outside of the peripheral area AA, and removed after the data line DL is tested. Thus, once the test area CA is removed, overall width of the peripheral area AA may decrease. For example, a distance between an edge of the display area DA and the common voltage line VCOML may be less than about 2 mm, but is not limited thereto.

In addition, the test pad 174 is formed in the test area CA and not in the peripheral area AA. Accordingly, elements formed in the display area AA and a gate driving part, such as an amorphous silicon gate (ASG), may be combined to the TFT substrate 200 or separated from the TFT substrate 200, with lesser likelihood of being damaged. The gate driving part may occur if the jig applies a test signal to the test pad 174.

Figure 6B:
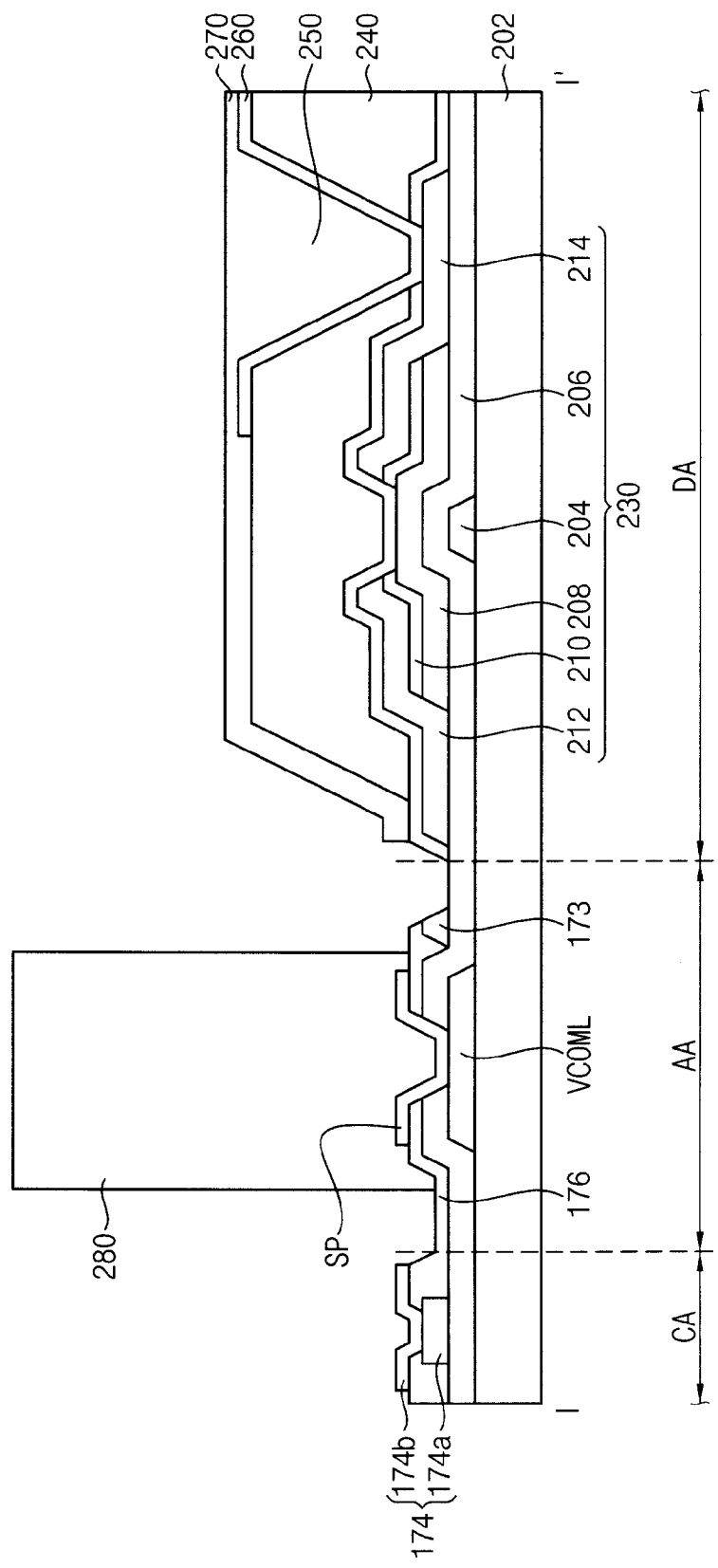
FIG. 6B is a cross-sectional view illustrating a portion 'B' of FIG. 6A according to an exemplary embodiment of the present invention.

FIG. 6A is a plan view illustrating a TFT substrate according to an exemplary embodiment of the present invention, and FIG. 6B is a cross-sectional view illustrating a portion 'B' of FIG. 6A.

The TFT substrate 201 may be substantially the same or similar as the TFT substrate 200 according to the previous exemplary embodiments illustrated in FIG. 1, FIG. 2, and FIG. 3 except for a test pad line 173. Thus, the same reference numerals will be used to refer to same or like parts as those described in the previous exemplary embodiments and any further repetitive explanation concerning the above elements will be omitted.

Referring to FIG. 6A and FIG. 6B, the TFT substrate 201 includes a disconnected test pad line 173 between the data line DL and the test pad 174. If the test signal is applied to the test pad 174 and the data line DL is tested, the test pad line 172 may disconnect from the test pad 174 to become the disconnected test pad line 173. The disconnected test pad line 173 may prevent or reduce the likelihood of an abnormal signal from being inputted to the data line DL and/or the TFT 230 that may be electrically connected with the data line DL. The test pad line 172 may be disconnected in at least one of an etching process and a laser radiating process.

In a method for manufacturing, the TFT substrate 201, the TFT 230, the organic insulating layer 240, the pixel electrode 260 and the first alignment layer 270 are formed on the first base substrate 202 of the display area DA. The common voltage line VCOML and the test pad line 172 are formed on the first base substrate 202 of the peripheral area AA. The test pad 174 is formed on the first base substrate 202 of the test area CA, and the sealing member 280 is formed in the peripheral area AA as illustrated in FIG. 5A, FIG. 5B, FIG. 5C, and FIG. 5D. The test pad line 172 is disconnected to become the disconnected test pad line 173.

According to an exemplary embodiment, the likelihood of an abnormal signal being inputted to the data line DL and the TFT 230 electrically connected with the data line DL may be reduced.

Figure 7:
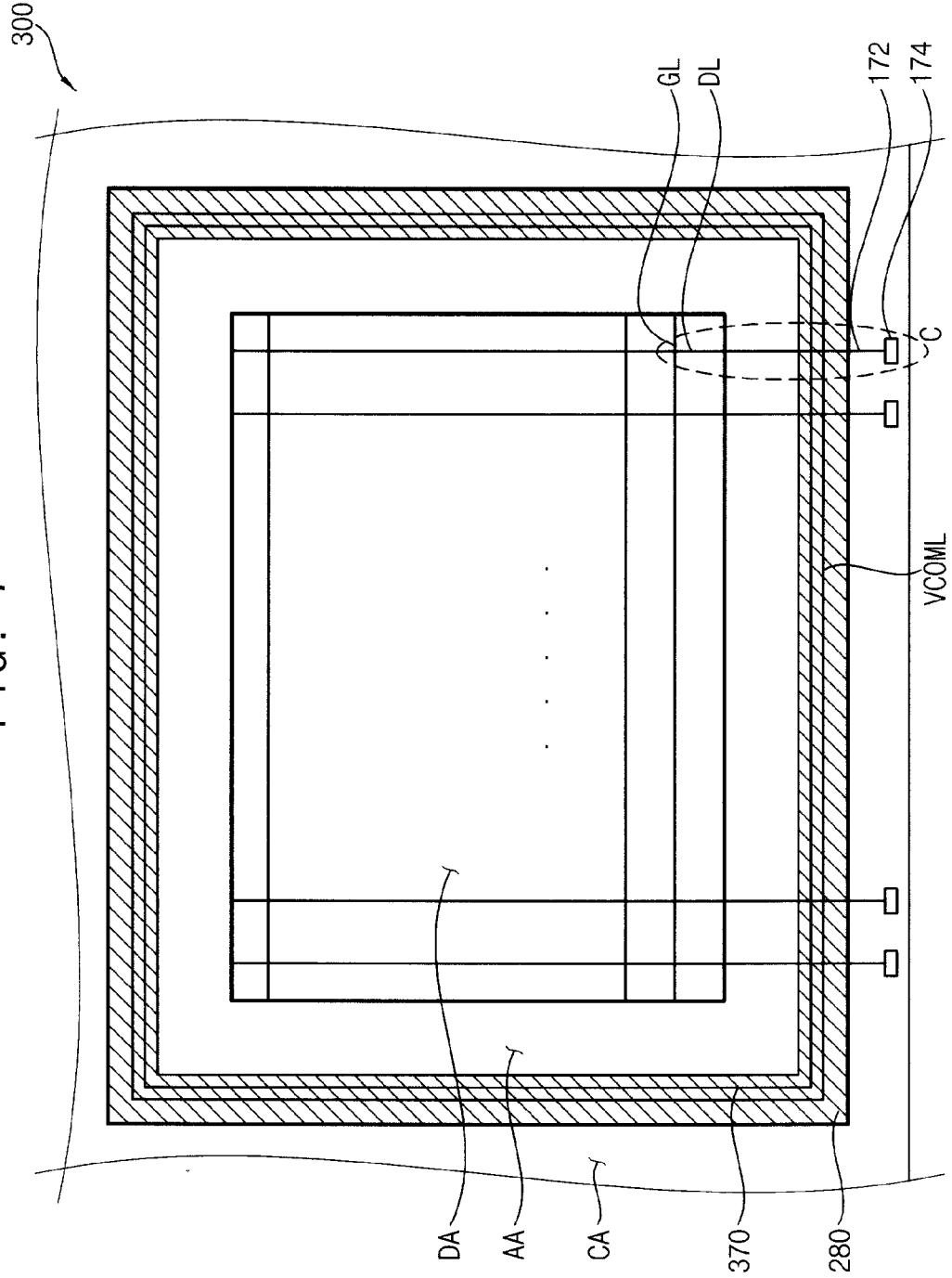
FIG. 7 is a plan view illustrating a TFT substrate according to an exemplary embodiment of the present invention.
Figure 8:
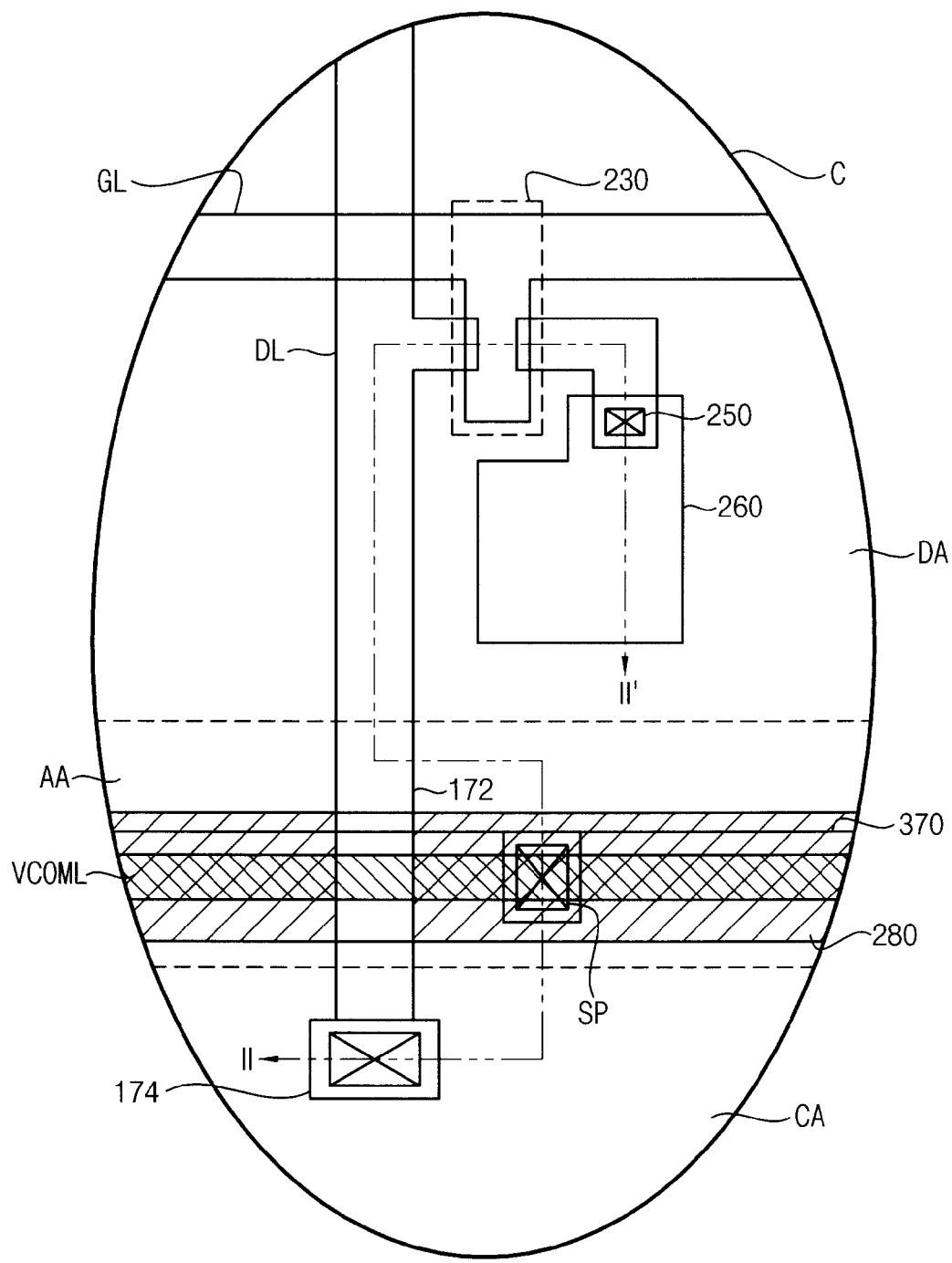
FIG. 8 is an enlarged plan view illustrating a portion 'C' of FIG. 7.
Figure 9:
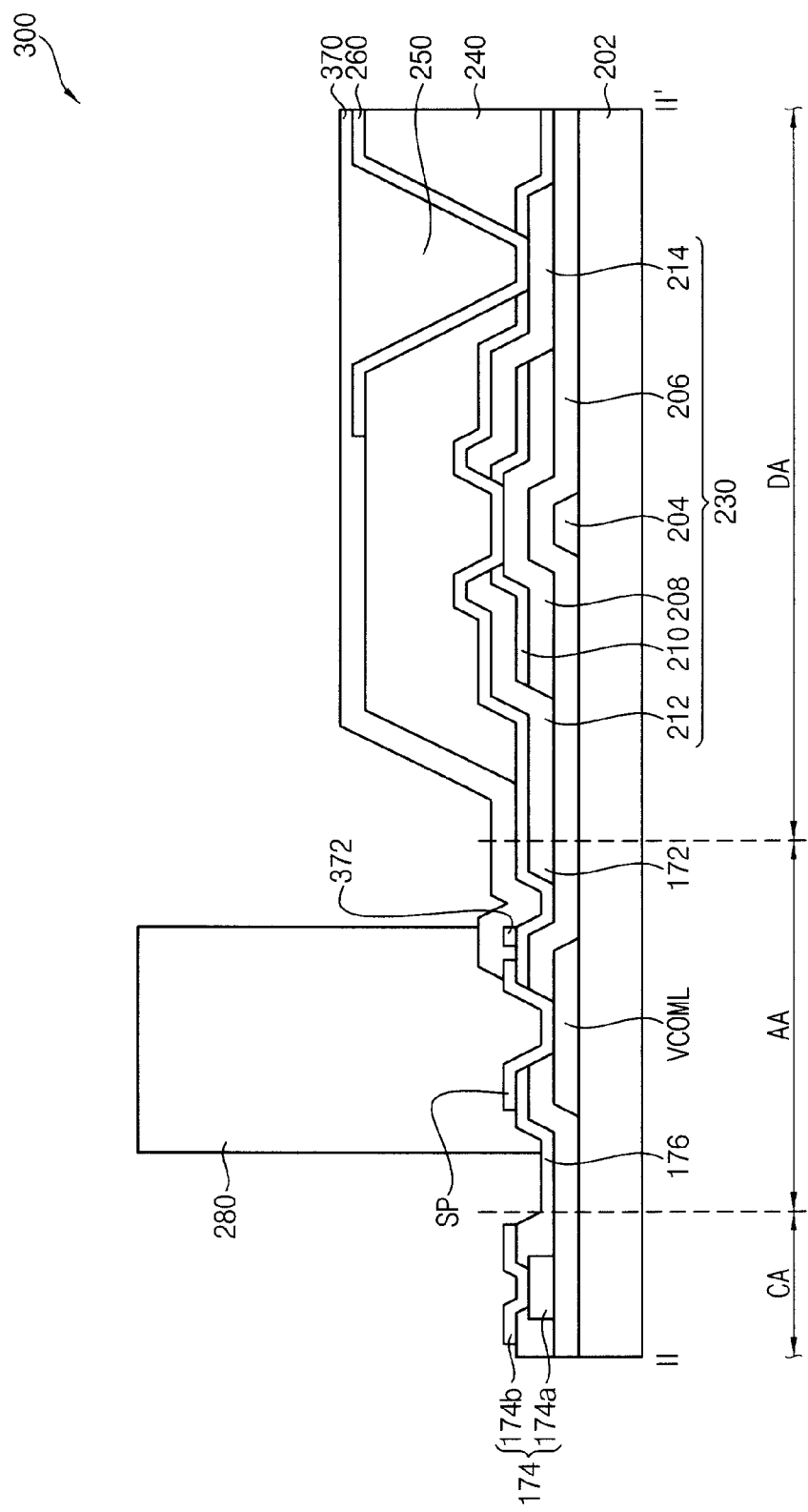
FIG. 9 is a cross-sectional view taken along a line II-II' of FIG. 8.

FIG. 7 is a plan view illustrating a TFT substrate according to an exemplary embodiment of the present invention, FIG. 8 is an enlarged plan view illustrating a portion 'C' of FIG. 7, and FIG. 9 is a cross-sectional view taken along a line II-II' of FIG. 8.

The TFT substrate 300 may be substantially the same or similar as the TFT substrate 200 according to the previous exemplary embodiment illustrated in FIG. 1, FIG. 2, and FIG. 3 except for a first alignment layer 370 and a first conductor 372. Thus, the same reference numerals will be used to refer to same or like parts as those described in the previous exemplary embodiments and any further repetitive explanation concerning the above elements will be omitted.

Referring to FIG. 7, FIG. 8, and FIG. 9, the TFT substrate 300 includes the display area DA to display an image, the peripheral area AA disposed adjacent to the display area DA, and the test area CA disposed outside of the peripheral area AA.

The gate lines GL and the data lines DL crossing the gate lines GL are formed in the display area DA of the TFT substrate 300 to display the image. In addition, the pixels are formed in the display area DA. One or more of the pixels may include the TFT 230 connected with one or more of the gate lines GL and one or more of the data lines DL, and the pixel electrode 260 electrically connected with the TFT 230.

The TFT substrate 300 includes the first base substrate 202, the gate lines GL, the data lines DL and the TFT 230 disposed on the first base substrate 202; the organic insulating layer 240 formed on the TFT 230; the pixel electrode 260 formed on the organic insulating layer 240, in which the pixel electrode 260 is electrically connected with the drain electrode 214 and a first alignment layer 370, in the display area DA. The pixel electrode 260 may be electrically connected with the drain electrode 214 through contact hole 250, which is formed through the organic insulating layer 240. The first alignment layer 370 may be formed on the pixel electrode 260 to align a liquid crystal of a liquid crystal layer.

The common voltage line VCOML transferring the common voltage is formed in the peripheral area AA surrounding the display area DA of the TFT substrate 300. The short point SP electrically connected with the common voltage line VCOML is formed on the common voltage line VCOML to transfer the common voltage of the common voltage line VCOML to the common electrode of the upper substrate.

In addition, the sealing member 280, which may be adhered to the upper substrate combined with the TFT substrate 300, is formed in the peripheral area AA to seal the liquid crystal of the liquid crystal layer. The sealing member 280 may include conductive material, and may be formed on the short point SP to make contact with the common electrode of the upper substrate. Thus, the sealing member 280 may receive the common voltage from the short point SP electrically connected with the common voltage line VCOML and may transfer the common voltage to the common electrode.

The test area CA of the TFT substrate 300 is disposed outside of the peripheral area AA in which the common voltage line VCOML is formed, as an area removed after the TFT substrate 300 and the upper substrate are connected with each other, or after the data line DL is tested. The test pad 174 to test the data line DL is formed in the test area CA. In addition, the test pad 174 may be connected with the data line DL formed in the display area DA.

The test pad line 172 connecting the data line DL with the test pad 174 is formed between the data line DL and the outer bounds of test pad 174. The test pad line 172 connects the data line DL with the test pad 174, and crosses the common voltage line VCOML in the peripheral area AA.

The common voltage line VCOML is formed on the first base substrate 202 of the TFT substrate 300 in the peripheral area AA, the insulating layer 206 is formed on the common voltage line VCOML, and the test pad line 172 crossing the common voltage line VCOML is formed on the insulating layer 206.

The insulating layer 206 is formed on the first base substrate 202 of the TFT substrate 300 in the test area CA, and the test pad 174 is formed on the insulating layer 206.

The passivation layer 176 may be further formed on or over the TFT 230, the test pad line 172 and the test pad 174.

The test pad 174 is formed in the test area CA outside of the peripheral area AA, and thus the width of the peripheral area AA may decrease. The sealing member 280 and the first alignment layer 370 may overlap with each other. The sealing member 280 may include conductive material so as to prevent or reduce the likelihood of the sealing member 280 from being uncured due to overlapping of the sealing member 280 and the first alignment layer 370. The first conductor 372 may be formed in the first alignment layer 370 on the passivation layer 176 overlapping with the sealing member 280. In an example, the first conductor 372 may include ITO or IZO.

FIG. 10A, FIG. 10B, FIG. 10C, and FIG. 10D are cross-sectional views illustrating a method for manufacturing a TFT substrate according to an exemplary embodiment of the present invention.

Figure 10A:
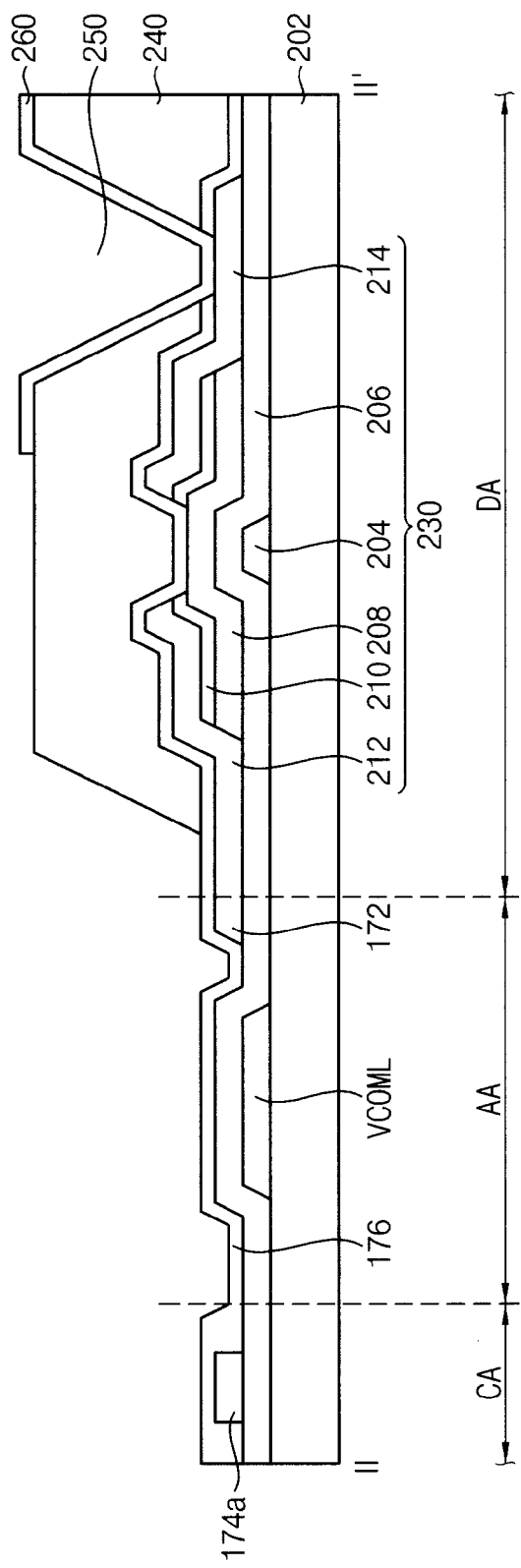

Referring to FIG. 10A, the gate line GL (not shown) and the gate electrode 204 may be formed on the first base substrate 202 of the display area DA, and the common voltage line VCOML is formed on the first base substrate 202 of the peripheral area AA. The insulating layer 206 may be formed on the gate line GL, the gate electrode 204, and the common voltage line VCOML. The active layer 208, the ohmic-contact layer 210, the data line, the source electrode 212 and the drain electrode 214 are formed on the insulating layer 206 of the display area DA to form the TFT 230. In addition, the test pad line 172, which may cross the common voltage line VCOML, is formed on the insulating layer 206 of the peripheral area AA, and the test pad end portion 174a is formed on the insulating layer 206 of the test area CA. The organic insulating layer 240 is formed on the TFT 230, and the pixel electrode 260 electrically connected with the drain electrode 214 of the TFT 230 through the contact hole 250 is formed, in the display area DA.

Referring to FIG. 10B, the first conductor 372 is formed on the passivation layer 176, which overlaps an area where the sealing member 280 is formed (see FIG. 10D), in the peripheral area AA. The short point SP electrically connected with the common voltage line VCOML is formed on the common voltage line VCOML, and the test pad electrode 174b is formed on the test pad end portion 174a.

Figure 10C:
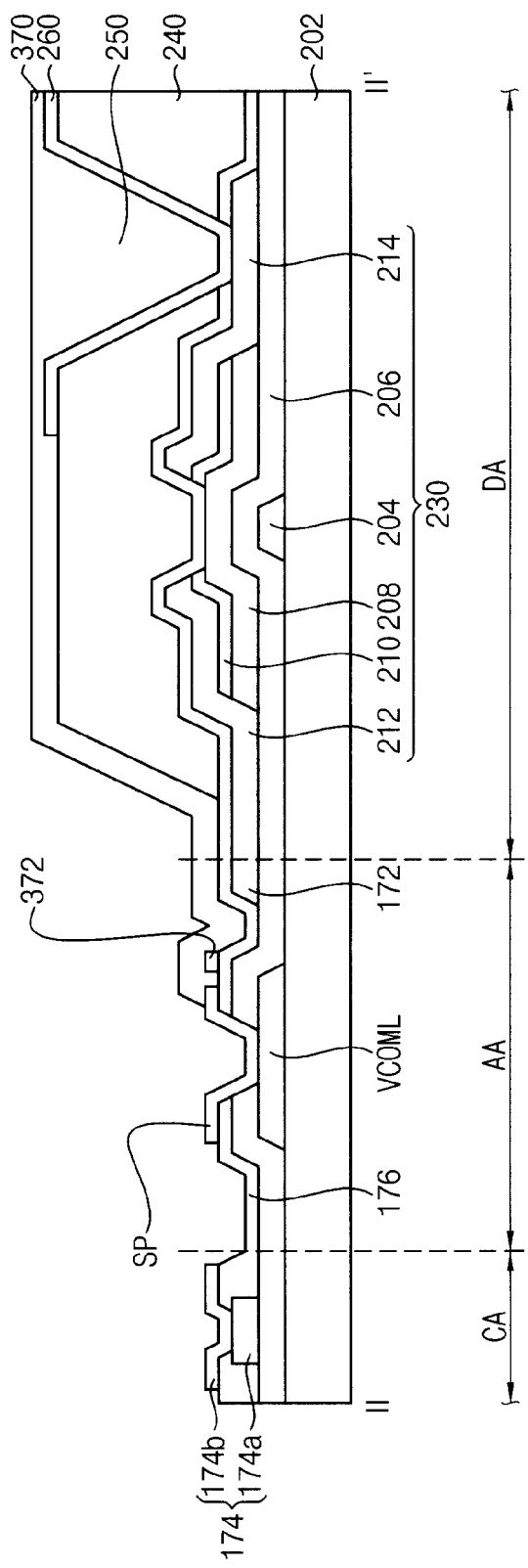

Referring to FIG. 10C, the first alignment layer 370 is formed on the pixel electrode 260.

Figure 10D:
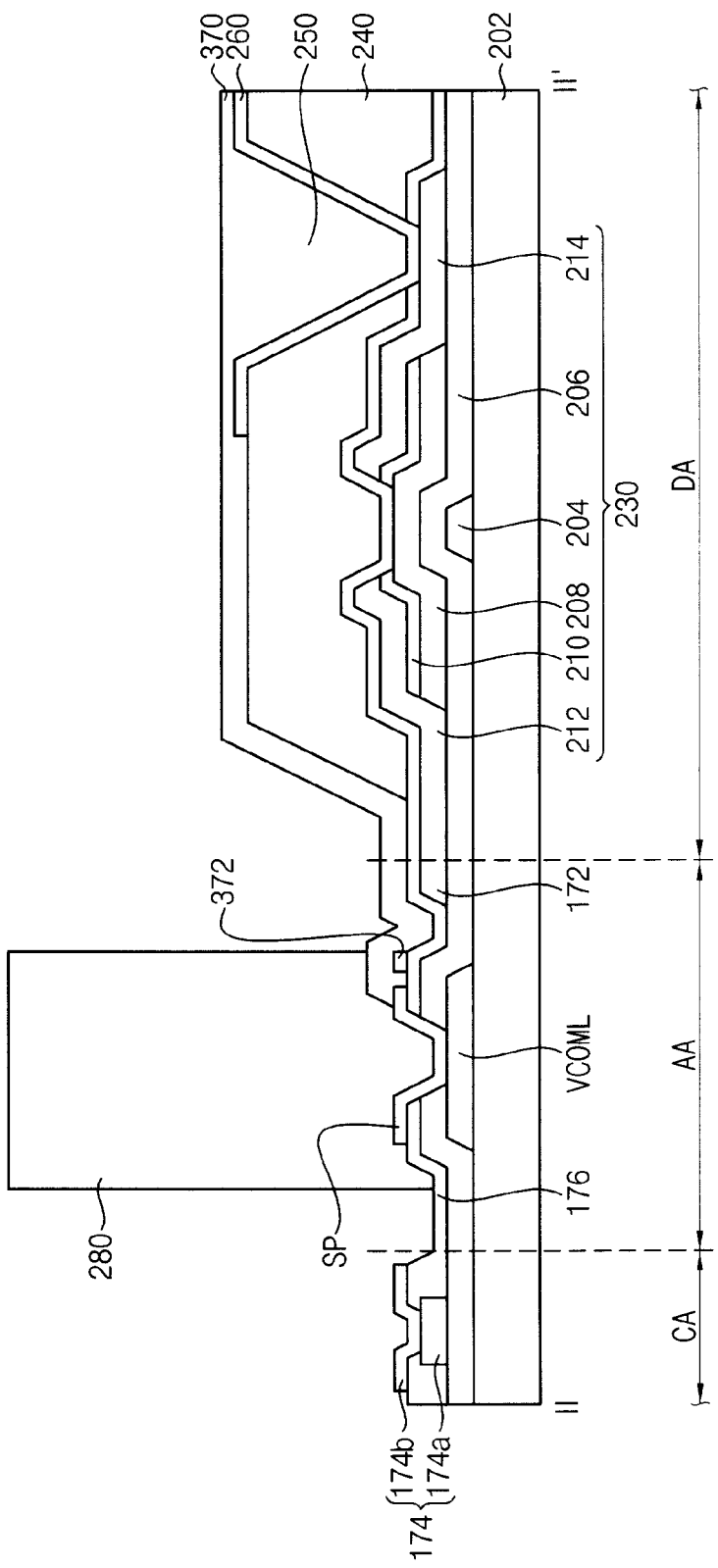

Referring to FIG. 10D, the sealing member 280 is formed in the peripheral area AA. The sealing member 280 may be electrically connected with the short point SP and overlaps the first alignment layer 370. The sealing member 280 is formed on the short point SP.

The first conductor 372 is formed in the first alignment layer 370 overlapping with the sealing member 280. The sealing member 280 may include a conductive material, and the sealing member 280 may be prevented or reduce the risk of being uncured due to overlapping of the sealing member 280 and the first alignment layer 370. Further, adhesive strength between the TFT substrate 300 and the upper substrate may be prevented or reduce the likelihood of becoming decreased.

Figure 11:
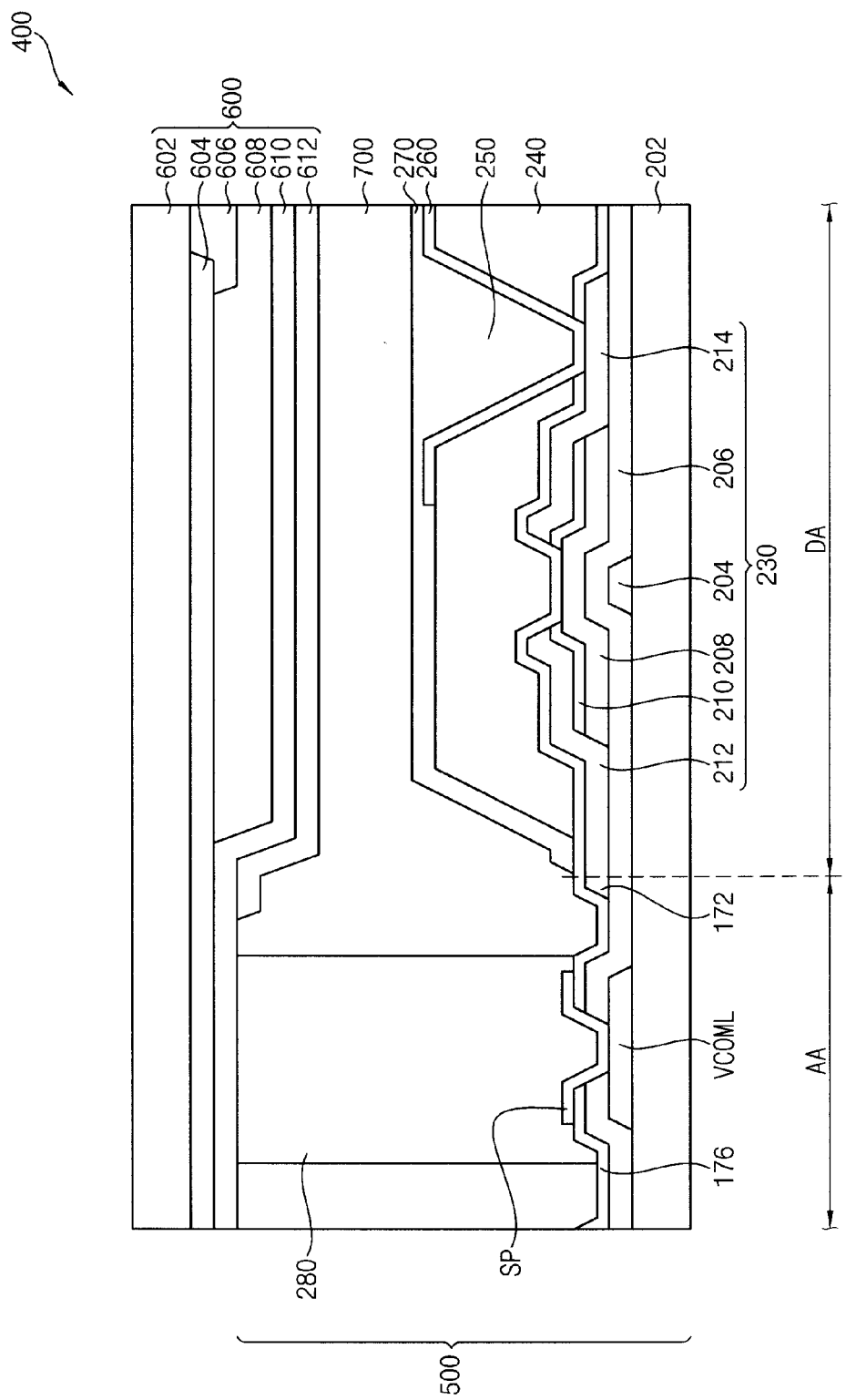
FIG. 11 is a cross-sectional view illustrating a display apparatus according to an exemplary embodiment of the present invention.

FIG. 11 is a cross-sectional view illustrating a display apparatus according to an exemplary embodiment of the present invention.

Referring to FIG. 11, the display apparatus 400 includes a lower substrate 500, an upper substrate 600 and a liquid crystal layer 700.

The lower substrate 500 may be similar or substantially the same as the TFT substrate 200 according to the previous exemplary embodiment illustrated in FIG. 1, FIG. 2, and FIG. 3 except for removing of the test area CA, in which the test pad 174 may be formed. Thus, the same reference numerals will be used to refer to same or like parts as those described in the previous embodiments and any further repetitive explanation concerning the above elements will be omitted.

The gate lines GL and the data lines DL crossing the gate lines GL may be formed in the display area DA of the lower substrate 500 to display the image. In addition, the pixels may be formed in the display area DA. One or more of the pixels may include the TFT 230 connected with one or more of the gate lines GL and one or more of the data lines DL; and the pixel electrode 260 electrically connected with the TFT 230.

The common voltage line VCOML transferring the common voltage is formed in the peripheral area AA of the lower substrate 500. The short point SP electrically connected with the common voltage line VCOML is formed on the common voltage line VCOML to transfer the common voltage of the common voltage line VCOML to a common electrode 610 of the upper substrate 600.

In addition, the test pad line 172 connecting the data line DL with the test pad 174, which may be formed in the test area CA that is removed and not shown in FIG. 11, and crossing the common voltage line VCOML is formed in the peripheral area AA surrounding the display area DA of the lower substrate 500. The test pad line 172 may be disconnected to prevent or reduce the likelihood that an abnormal signal being transmitted to the data line DL and/or the TFT 230 connected with the data line DL.

The sealing member 280 adhered to the upper substrate 600 is formed in the peripheral area AA to seal a liquid crystal of the liquid crystal layer 700. The sealing member 280 may include conductive material, and may be formed on the short point SP to make contact with the common electrode 610 of the upper substrate 600. Thus, the sealing member 280 may receive the common voltage from the short point SP, which may be electrically connected with the common voltage line VCOML, and may transfer the common voltage to the common electrode 610. The sealing member 280 may be spaced apart from the first alignment layer 270 to prevent or reduce the likelihood of the sealing member 280 from being uncured in forming the sealing member 280.

The upper substrate 600 includes a second base substrate 602, a black matrix 604, a color filter 606 formed under the second base substrate 602, an over-coating layer 608 formed under the black matrix 604 and the color filter 606, the common electrode 610 formed under the over-coating layer 608, and a second alignment layer 612 formed under the common electrode 610 to align the liquid crystal of the liquid crystal layer 700.

In an example, the TFT 230, the organic insulating layer 240, the pixel electrode 260 and the first alignment layer 270 may be formed on the first base substrate 202 of the display area DA; the common voltage line VCOML and the test pad line 172 may be formed on the first base substrate 202 of the peripheral area AA; the test pad 174 may be formed on the first base substrate 202 of the test area CA; and the sealing member 280 may be formed in the peripheral area AA as illustrated in FIG. 5A, FIG. 5B, FIG. 5C, and FIG. 5D. A boundary between the peripheral area AA and the test area CA may be allocated to remove the test area CA, once testing of the electrical short and/or the open electrical circuit of the data line DL by applying the test signal to the test pad 174.

The upper substrate 600 is formed. The black matrix 604, the color filter 606, the over-coating layer 608, the common electrode 610, and the second alignment layer 612 are formed on the second base substrate 602.

The lower substrate 500 and the upper substrate 600 may be connected or combined with each other. For example, the lower substrate 500 and the upper substrate 600 may be connected such that the common voltage line VCOML and the common electrode 610 are electrically connected with each other through the short point SP and the sealing member 280, while the sealing member 280 and the second alignment layer 612 are spaced apart from each other.

The liquid crystal is interposed between the lower substrate 500 and the upper substrate 600 to form the liquid crystal layer 700.

The electrical short and the open electrical circuit of the data line DL may be tested by applying the test signal to the test pad 174. Once tested, the test pad line 172 may be disconnected, and the test area CA of the lower substrate 500 may be removed. The test area CA may be removed after the data line DL is tested or after the lower substrate 500 and the upper substrate 600 are combined or connected.

The test pad 174 may be used to test the data line DL. The test pad 174 is formed in the test area CA, which may be disposed outside of the peripheral area AA, and removed after the data line DL is tested. Thus, a display apparatus with a narrower bezel may be manufactured.

Figure 12:
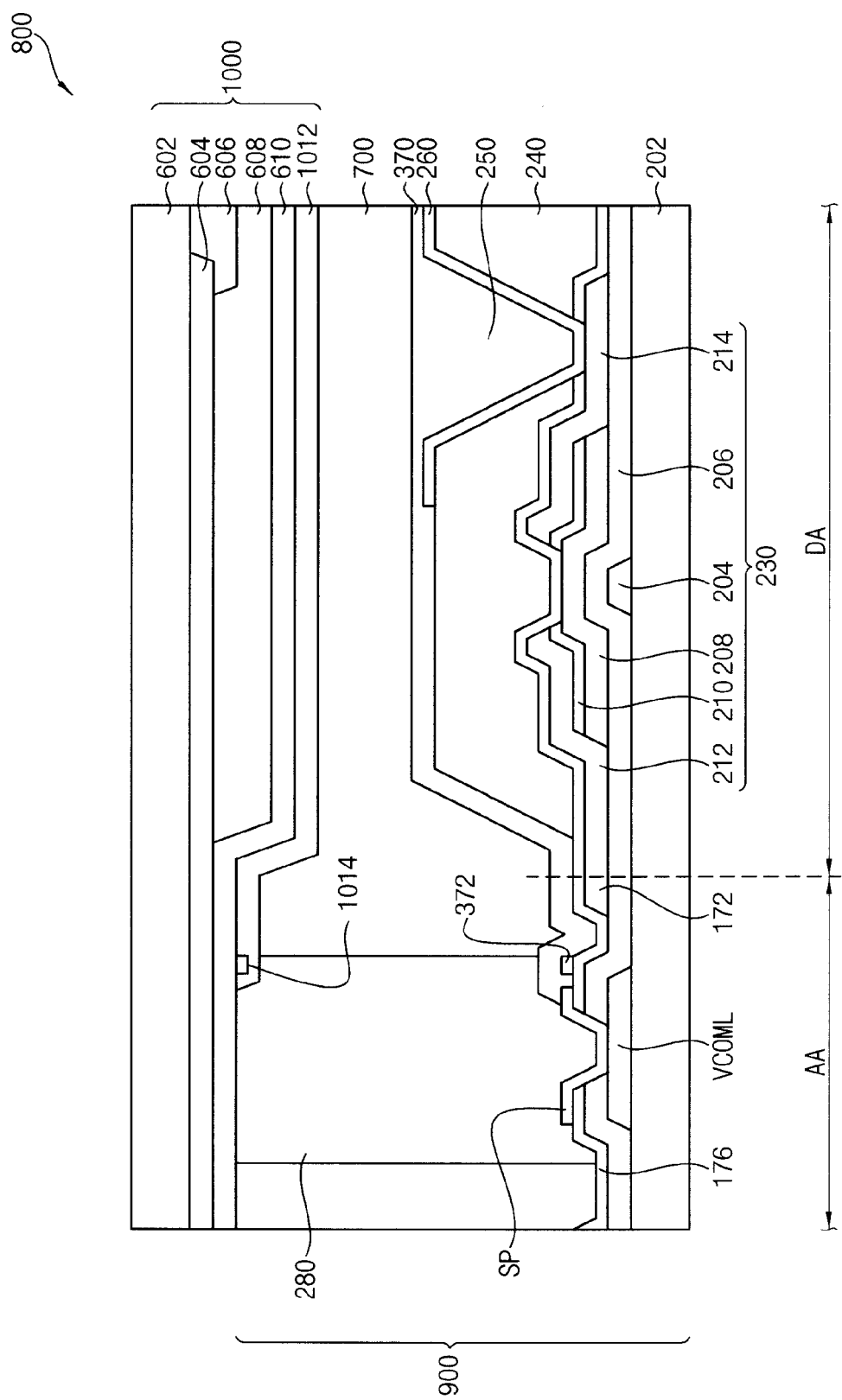
FIG. 12 is a cross-sectional view illustrating a display apparatus according to an exemplary embodiment of the present invention.

FIG. 12 is a cross-sectional view illustrating a display apparatus according to an exemplary embodiment of the present invention.

Referring to FIG. 12, the display apparatus 800 includes a lower substrate 900, an upper substrate 1000 and the liquid crystal layer 700.

The lower substrate 900 according to the present example embodiment is similar or substantially the same as the TFT substrate 300 according to the previous exemplary embodiments illustrated in FIG. 7, FIG. 8, and FIG. 9 except for the absence of the test area CA, in which the test pad 174 is formed. Thus, the same reference numerals will be used to refer to same or like parts as those described in the previous exemplary embodiments and any further repetitive explanation concerning the above elements will be omitted.

The gate lines GL and the data lines DL crossing the gate lines GL may be formed in the display area DA of the lower substrate 900 to display the image. In addition, the pixels may be formed in the display area DA. One or more of the pixels may include the TFT 230 connected with one or more of the gate lines GL and one or more of the data lines DL, and the pixel electrode 260 electrically connected with the TFT 230.

The common voltage line VCOML transferring the common voltage is formed in the peripheral area AA of the lower substrate 900. The short point SP electrically connected with the common voltage line VCOML is formed on the common voltage line VCOML to transfer the common voltage of the common voltage line VCOML to the common electrode 610 of the upper substrate 1000.

In addition, the test pad line 172 connecting the data line DL with the test pad 174 may be formed in the test area CA, which is cut to be removed. The test pad line 172 crossing the common voltage line VCOML is formed in the peripheral area AA of the lower substrate 900. The test pad line 172 may be disconnected to prevent or reduce the likelihood of an abnormal signal from being transmitted to the data line DL and/or the TFT 230 connected with the data line DL.

The sealing member 280 adhered to the upper substrate 1000 is formed in the peripheral area AA to seal the liquid crystal of the liquid crystal layer 700. The sealing member 280 may include conductive material, and may be formed on the short point SP to make contact with the common electrode 610 of the upper substrate 1000. Thus, the sealing member 280 may receive a common voltage from the short point SP, which is electrically connected with the common voltage line VCOML, and may transfer the common voltage to the common electrode 610.

The sealing member 280 and an end portion of the first alignment layer 370 may overlap with each other in the peripheral area AA. The sealing member 280 may include conductive material to prevent or reduce the likelihood of the sealing member 280 from being uncured due to overlapping of the sealing member 280 and the first alignment layer 370. The first conductor 372 may be formed in or under the first alignment layer 370, which is formed on the passivation layer 176 and overlaps the sealing member 280.

The upper substrate 1000 is similar or substantially the same as the upper substrate 600 according to the previous exemplary embodiment illustrated in FIG. 11 except for a second alignment layer 1012 and a second conductor 1014. Thus, the same reference numerals will be used to refer to same or like parts as those described in the previous exemplary embodiment and any further repetitive explanation concerning the above elements will be omitted.

The upper substrate 1000 includes the second base substrate 602, the black matrix 604, the color filter 606 formed under the second base substrate 602, the over-coating layer 608 formed under the black matrix 604 and the color filter 606, the common electrode 610 formed under the over-coating layer 608, and the second alignment layer 1012 formed under the common electrode 610 to align the liquid crystal of the liquid crystal layer 700.

The sealing member 280 and an end portion of the second alignment layer 1012 may overlap with each other in the peripheral area AA. The sealing member 280 may include conductive material to prevent or reduce the likelihood of the sealing member 280 from being uncured due to overlapping of the sealing member 280 and the second alignment layer 1012. The second conductor 1014 may be formed in or under the second alignment layer 1012, which is formed on the common electrode 610 overlapping with the sealing member 280.

The lower substrate 900 is formed. In an example, the TFT 230, the organic insulating layer 240, the pixel electrode 260, and the first alignment layer 270 are formed on the first base substrate 202 of the display area DA; the common voltage line VCOML and the test pad line 172 are formed on the first base substrate 202 of the peripheral area AA; the test pad 174 may be formed on the first base substrate 202 of the test area CA; and the first conductor 372 and the sealing member 280 are formed in the peripheral area AA as similarly illustrated in FIGS. 10A, 10B, 10C, and 10D. A boundary between the peripheral area AA and the test area CA may be allocated to remove the test area CA. The test area CA may be removed once testing the electrical short and/or the open electrical circuit of the data line DL is conducted by applying the test signal to the test pad 174.

The upper substrate 1000 is formed. For example, the black matrix 604, the color filter 606, the over-coating layer 608, the common electrode 610, the second conductor 1014 and the second alignment layer 1012 are formed under the second base substrate 602.

The lower substrate 900 and the upper substrate 1000 may be combined or connected with each other. For example, the lower substrate 900 and the upper substrate 1000 are combined or connected, such that the common voltage line VCOML and the common electrode 610 are electrically connected with each other through the short point SP and the sealing member 280. The sealing member 280 and the second alignment layer 1012 may overlap with each other.

The liquid crystal is interposed between the lower substrate 900 and the upper substrate 1000 to form the liquid crystal layer 700.

The electrical short and the open electrical circuit of the data line DL may be tested by applying the test signal to the test pad 174. Once tested, the test pad line 172 may be disconnected, and the test area CA of the lower substrate 900 may be removed. The test area CA may be removed after the data line DL is tested or after the lower substrate 900 and the upper substrate 1000 are combined or connected.

The first conductor 372 is formed in or under the first alignment layer 370 overlapping with the sealing member 280, the second conductor 1014 is formed in the second alignment layer 1012 overlapping with the sealing member 280. Also, the sealing member 280 may include conductive material. Accordingly, the sealing member 280 may be prevented or less likely from being uncured due to overlapping of the sealing member 280 and the first alignment layer 370. Further, overlapping of the sealing member 280 and the second alignment layer 1012, and adhesive strength between the lower substrate 900 and the upper substrate 1000 combined or connected with each other may be prevented from being decreased.

According to the TFT substrate, the method of manufacturing the TFT substrate and the display apparatus having the TFT substrate, a test pad may be formed in removed test area disposed outside of a peripheral area in which a common voltage line and a sealing member are formed. In addition, the test pad may be removed after the data line is tested and/or after a lower substrate and an upper substrate is connected or combined with each other. Thus, a display apparatus with a narrower bezel may be manufactured.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A thin-film transistor (TFT) substrate, comprising:
  a base substrate, comprising:
    a display area comprising a data line and a TFT,
    a peripheral area comprising a common voltage line, and
    a test area disposed outside of the peripheral area;
  a test pad disposed in the test area and electrically connected to the data line;
  a test pad line connecting the data line with the test pad and crossing the common voltage line; and
  a short point disposed on the common voltage line and spaced apart from the test pad line,
  wherein the short point is disposed between the test pad and another test pad.

2. The TFT substrate of claim 1,
  wherein the short point is electrically connected to the common voltage line.

3. The TFT substrate of claim 2, wherein the test pad line has a curved portion.

4. The TFT substrate of claim 1, wherein the test pad is configured to receive a test signal used to test for an open electrical circuit or an electrical short of the data line.

5. The TFT substrate of claim 1, wherein the test area is configured to be a removable area.

6. A method for manufacturing a thin-film transistor (TFT) substrate, the method comprising:
  forming a common voltage line in a peripheral area of a base substrate, the base substrate comprising a display area to display an image, and a test area disposed outside of the peripheral area, the peripheral area surrounding the display area;
  forming a data line disposed in the display area and a test pad line disposed in the peripheral area, and the test pad line crosses the common voltage line;
  forming a test pad in the test area, wherein the test pad is connected to the test pad line; and forming a short point disposed on the common voltage line and spaced apart from the test pad line,
wherein the short point is disposed between the test pad and another test pad.

7. The method of claim 6, wherein the short point is electrically connected to the common voltage line.

8. The method of claim 6, further comprising:
testing the data line; and
cutting, after testing the data line, the test pad line at a portion of the test pad line disposed between the data line and the test pad.

9. The method of claim 8, wherein the test pad line is cut by at least one of an etching process and a laser radiating process.

10. The method of claim 6, further comprising:
testing the data line; and
removing, after testing the data line, the test area.

11. A display apparatus, comprising:
a first base substrate comprising a display area, a peripheral area, a data line, a thin-film transistor (TFT), and a pixel electrode;
a common voltage line disposed in the peripheral area of the first base substrate;
a test area disposed outside of the peripheral area of the first base substrate;
a test pad disposed in the test area and electrically connected to the data line;
a test pad line crossing the common voltage line;
a second base substrate facing the first base substrate;
a common electrode disposed on the second base substrate;
a liquid crystal layer interposed between the first base substrate and the second base substrate; and
a short point disposed on the common voltage line and spaced apart from the test pad line,
wherein the short point is disposed between the test pad and another test pad.

12. The display apparatus of claim 11, wherein the first base substrate further comprises:
a sealing member adhered to the second base substrate, the sealing member being disposed outside of the peripheral area; and
an alignment layer disposed on the pixel electrode.

13. The display apparatus of claim 12, wherein the sealing member comprises a conductive material.

14. The display apparatus of claim 13, wherein the sealing member electrically connects the common electrode with the short point.

15. The display apparatus of claim 12, wherein the sealing member is spaced apart from the alignment layer.

16. The display apparatus of claim 12, wherein the sealing member overlaps with a portion of the alignment layer.

17. The display apparatus of claim 16, further comprising:
a conductor disposed in an overlapping area, wherein the sealing member and the alignment layer overlap each other.

18. The display apparatus of claim 11, wherein the common voltage line and the test pad line are insulated from each other.

* * * * *